(12) United States Patent
Fang et al.

(10) Patent No.: US 6,255,177 B1
(45) Date of Patent: Jul. 3, 2001

(54) METHOD FOR FABRICATING A SALICIDE GATE

(75) Inventors: Edberg Fang, Yuanlin Hsien; Wen-Yi Hsieh, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/568,321

(22) Filed: May 9, 2000

(30) Foreign Application Priority Data

Mar. 17, 2000 (TW) ................................. 89104924

(51) Int. Cl.7 .................................. H01L 21/336
(52) U.S. Cl. .................. 438/299; 438/303; 438/430; 438/595; 438/655; 438/695; 438/682
(58) Field of Search ................... 438/299, 300, 438/302, 231, 303–305, 430, 595, 649, 655, 695, 660, 664, 682

(56) References Cited

U.S. PATENT DOCUMENTS

| | | | |
|---|---|---|---|
| 5,908,313 | * 6/1999 | Chau et al. | 438/299 |
| 5,956,590 | * 9/1999 | Hsieh et al. | 438/303 |
| 6,025,241 | * 2/2000 | Lin et al. | 438/303 |

\* cited by examiner

*Primary Examiner*—Matthew Smith
*Assistant Examiner*—Igwe U. Anya
(74) *Attorney, Agent, or Firm*—Thomas, Kayden, Horstemeyer & Risley

(57) ABSTRACT

A fabrication method for a salicide gate is described, wherein the method comprising forming a gate structure on a substrate. The gate structure comprises a polysilicon gate and a selective-deposition dummy layer formed on the polysilicon gate. Source/drain regions are then formed on both sides of the gate structure in the substrate. After this, a dielectric layer is selectively deposited on the substrate, wherein the dielectric layer on the source/drain regions is thicker than the dielectric layer on the anti-reflection layer. A portion of the dielectric layer is removed until the anti-reflection layer is exposed. The anti-reflection layer is subsequently removed, followed by forming a salicide layer on the polysilicon gate to complete the manufacturing of a salicide gate.

20 Claims, 3 Drawing Sheets

METHOD FOR FABRICATING A SALICIDE GATE

CROSS-REFERENCE TO RELATED APPLICATION

This application claims the priority benefit of Taiwan application Ser. No. 89104924, filed Mar. 17, 2000.

BACKGROUND OF THE INVENTION

1. Field of the Invention

The present invention relates to a method for fabricating a semiconductor device. More particularly, the present invention relates to a fabrication method for a salicide gate.

2. Description of the Related Art

There is a continuing effort in the semiconductor industry to increase the integration density on a semiconductor device, for example, by reducing the device dimension. As a result, the gate resistance is increased, leading to an increase of the gate response time. Currently, the common approach to reduce the gate response time and to increase the operational speed of a device is to form a salicide layer on the polysilicon gate. A polysilicon gate with a salicide layer formed thereon is known as a salicide gate. FIG. 1A to 1C are cross-sectional views showing the processing of a salicide gate according to the prior art.

As shown in FIG. 1A, a gate oxide layer 110 and a polysilicon gate 120 is formed on a substrate 100. Spacers 130 are further formed on the sidewalls of the gate oxide layer 110 and the polysilicon gate 120. An ion implantation is then conducted to form a pair of source/drain regions 140 in the substrate 100 on both sides of the spacers 130. After this, a metal layer 150 is deposited on the substrate 100.

Continuing to FIG. 1B, a thermal process is conducted to induce a reaction between the metal layer 150 and the source/drain regions 140 and the polysilicon gate 120, respectively, to form a salicide layer 170 on the source/drain region 140 and a salicide layer 160 on the polysilicon gate 120. The unreacted metal layer 150, as shown in FIG. 1C, is removed to complete the manufacturing of a salicide gate 180.

This conventional approach in forming a salicide gate, however, has its disadvantages, especially for a dynamic random access memory (DRAM) device. Although the gate resistance is reduced in the conventional approach, a low resistance salicide layer is also formed on the source/drain regions. A higher leakage current is thus existed between the source/drain regions and the capacitor of the DRAM cell, which adversely affecting the data retention characteristics of the DRAM cell. The DRAM cell must therefore be refreshed frequently and the operational efficiency of the device is thereby reduced.

SUMMARY OF THE INVENTION

Based on the foregoing, the present invention provides an improved method in forming a salicide gate, wherein the salicide layer is only formed on the polysilicon gate but not on the source/drain regions to lower the leakage current between the source/drain regions and the capacitor of the DRAM cell.

In the method of the present invention for fabricating a salicide gate, a gate structure is formed on a substrate at first. The gate structure includes a polysilicon gate and a selective-deposition dummy layer formed thereon. Source/drain regions are then formed on both sides of the gate structure. A dielectric layer is then selectively formed on the substrate, wherein the dielectric layer on the source/drain regions is thicker than on the selective deposition dummy layer on the gate structure. A portion of the dielectric layer is then removed until the selective-deposition dummy layer is exposed. The selective-deposition dummy layer is subsequently removed to expose the polysilicon gate, followed by forming a salicide layer on the polysilicon gate to complete the formation of a salicide gate.

According to the present invention of forming a salicide gate, a thicker dielectric layer is formed on the source/drain regions. As a result, a substantial portion of the dielectric layer is still remained on the source/drain region when the dielectric layer on the selective-deposition dummy layer is being removed. The source/drain regions, being isolated by the dielectric layer, are therefore prevented from having a salicide layer formed thereon. The salicide layer hence can only be formed on the polysilicon gate.

Since the salicide layer is formed only on the polysilicon gate and not on the source/drain regions, lithography and etching of the salicide layer on the source/drain region can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

The fabrication method for a salicide gate, respectively in accordance with the present invention is described with reference to FIGS. 2A to 2G. FIGS. 2A to 2G represent a cross-sectional view showing various stages of the fabrication process of a salicide gate according to one embodiment of the present invention.

Figure 1A:
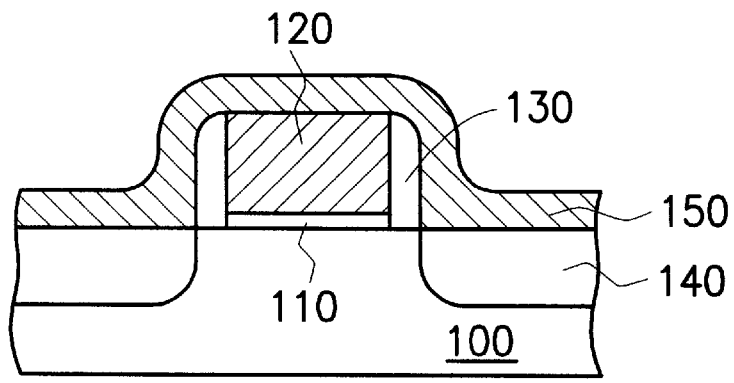
FIGS. 1A to 1C are schematic, cross-sectional views showing the manufacturing of a salicide gate according to the prior art.
Figure 1B:
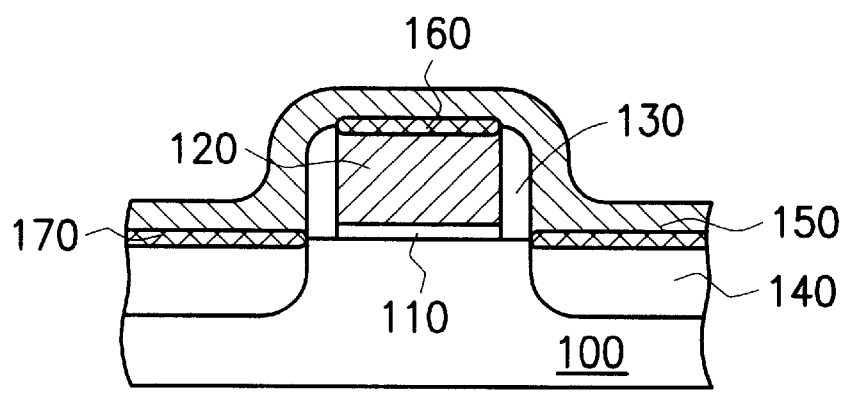
Figure 1C:
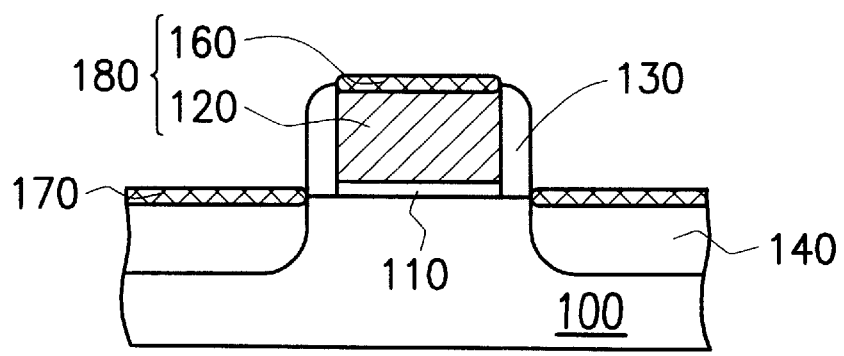
Figure 2A:
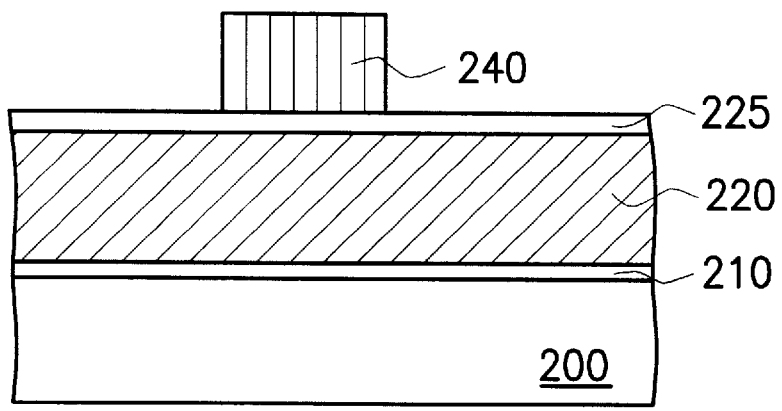
FIGS. 2A to 2G are schematic, cross-sectional views showing the manufacturing of a salicide gate according to the preferred embodiment of the present invention.

Referring to FIG. 2A, a substrate 200 is provided. A gate oxide layer 210, a polysilicon layer 220 and a selective-deposition dummy layer 225 are sequentially formed on the substrate 200. A patterned photo resist layer 240 is also formed on the selective-deposition dummy layer 225. The selective-deposition dummy layer 225, such as titanium nitride, is formed, for example, by reactive sputtering deposition.

Figure 2B:
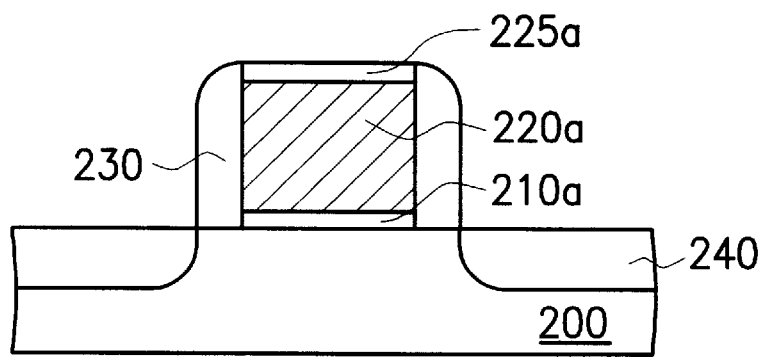

As shown in FIG. 2B, using the patterned photo resist layer 240 as a mask, a portion of the selective-deposition dummy layer 225, the polysilicon layer 220 and the gate oxide layer 210 are removed to form the polysilicon gate 220a, the selective-deposition dummy layer 225a and the gate oxide layer 210a. Spacers 230, such as silicon nitride spacers of about 1000 angstroms wide, are subsequently formed on the sidewalls of the polysilicon gate 220a, the selective-deposition dummy layer 225a and the gate oxide layer 210a. Further using the spacers 230 and the selective-deposition dummy layer 225a as masks, ion implantation is conducted to form the source/drain regions 240 in the substrate 200 on the sides of the spacers 230.

Figure 2C:
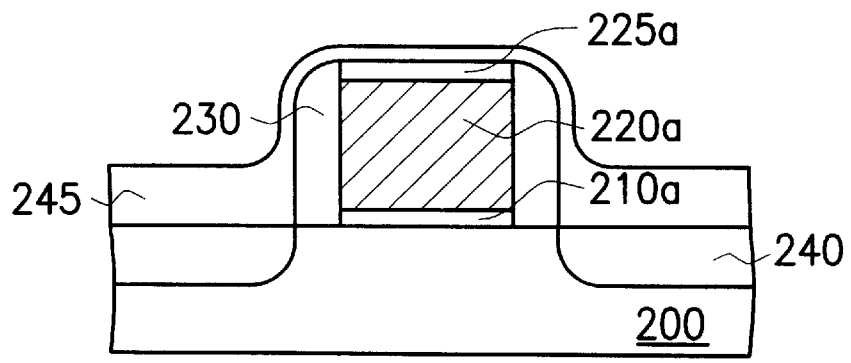

Continuing to FIG. 2C, a selective deposition is conducted to form a dielectric layer 245 on the substrate 200, wherein the deposition selectivity ratio of the dielectric layer on the source/drain regions to that on the selective-deposition dummy layer 225a is greater than 1. As a result, the dielectric layer 245 on the source/drain regions 240 is thicker than the dielectric layer 245 on the selective-deposition dummy layer 225a. The dielectric layer 245, such as a silicon oxide layer, is formed by atmospheric pressure chemical vapor deposition (APCVD) or sub-atmospheric chemical vapor deposition (SACVD). The ratio of the thickness of the dielectric layer on the source/drain region 240 to that on the selective-deposition dummy layer 225a is preferably greater than 5. The thickness of the dielectric layer 245 on the source/drain region 240 is about 500 angstroms to about 1000 angstroms. The thickness of the dielectric layer 245 on the selective-deposition dummy layer 225a is about 100 angstroms to about 200 angstroms.

Selective deposition is based on the difference in the electro negativity between the reactive gas and the dielectric layer and the selective-deposition dummy layer respectively. In another words, the affinity of the reactive gas is different with different materials. As a result, a different thickness of the deposited material is formed on different materials. For example, when $O_3$/TEOS is used as the reactive gas source to form the silicon oxide layer and the ratio of $O_3$ to TEOS is greater than 1, the rate of forming silicon oxide on a silicon layer, a silicon oxide layer and a titanium nitride layer is rated as: silicon>silicon oxide>titanium nitride. When the concentration of $O_3$ or the thickness of the titanium nitride layer is further increased, the selectivity ratio of the silicon oxide formed on a silicon layer to that formed on the titanium nitride layer is also increased, which means the silicon oxide layer formed on the silicon layer is even thicker. Accordingly, when the selective-deposition dummy layer 225a is titanium nitride and the dielectric layer 245 is silicon oxide, the thickness ratio of the dielectric layer 245 formed on the source/drain regions and on the anti-reflection layer 225a can be controlled by adjusted the ratio of $O_3$ to TEOS of the reactive gas, or by adjusting the thickness of the anti-reflection layer 225a previously.

Figure 2D:
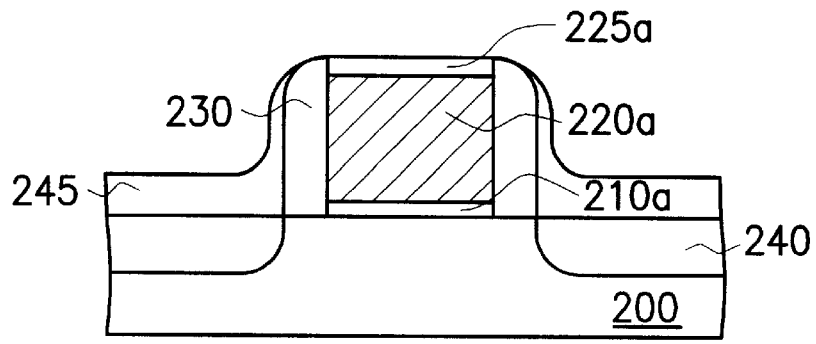

Continuing to FIG. 2D, a portion of the dielectric layer 245 is removed until the selective-deposition dummy layer 225a is exposed. The portion of the dielectric layer 245 is removed, for example, by anisotropic etching using the selective-deposition dummy layer 225a as an etching stop layer. Since the dielectric layer 245 on the selective-deposition dummy layer 225a is thinner, a dielectric layer 245 having a substantial thickness is still remained on the source/drain regions when the selective-deposition dummy layer 225a is exposed.

Figure 2E:
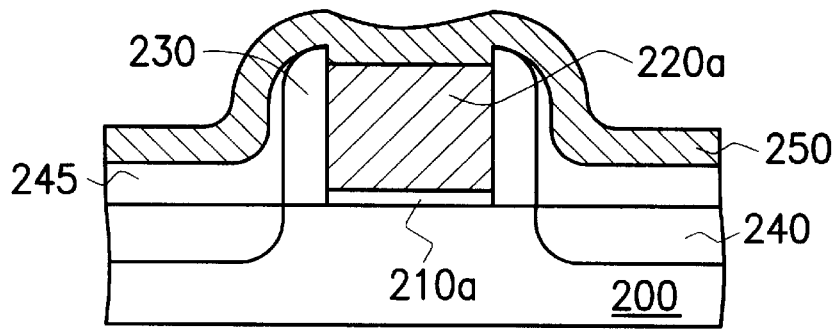

As shown in FIG. 2E, the selective-deposition dummy layer 225a is then removed until the surface of the polysilicon gate 220a is exposed. After this, a metal layer 250 is formed on the substrate 200. The metal layer 250 includes titanium (Ti), colbalt (Co), tungsten (W), nickel (Ni), palladium, (Pd) and platinum (Pt). Since the source/drain regions 240 are isolated by the dielectric layer 245, the metal layer 250 can only be in contact with the polysilicon gate 220a, and not with the source/drain regions.

Figure 2F:
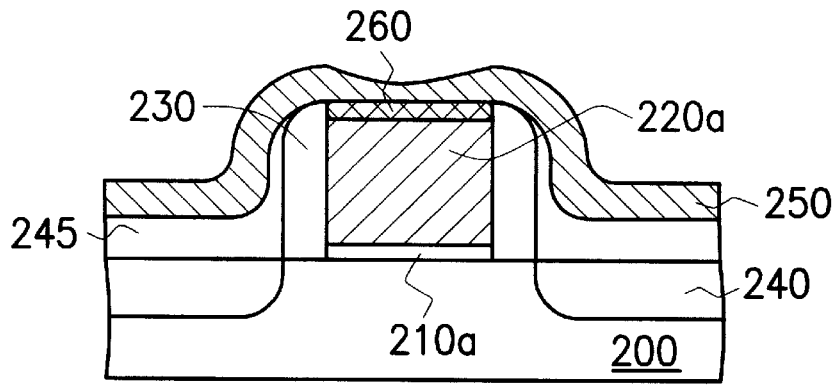

Referring to FIG. 2F, a thermal process is conducted to induce a reaction between the metal layer 250 and the polysilicon gate 220a to form a self-aligned silicide layer or a salicide layer 260 on the polysilicon gate 220a. The thermal process, for example, a rapid thermal process (RTP) is conducted at a temperature of about 400 degree Celsius to about 800 degree Celsius.

Figure 2G:
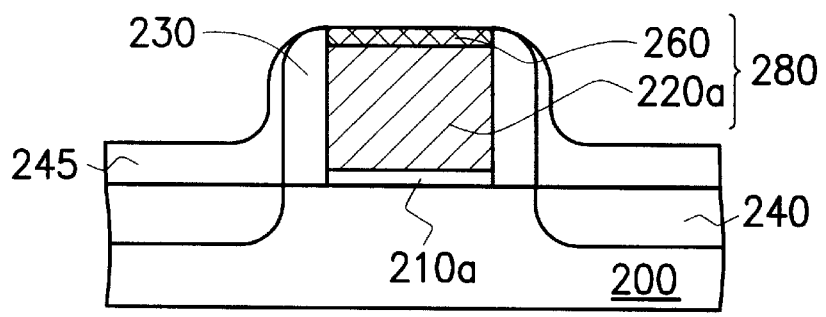

Continuing to FIG. 2G, the unreacted metal layer 250 is removed, exposing the salicide layer 260. Another thermal process is conducted to lower the resistance of the salicide layer 260 and to complete the formation of a salicide gate 280. The thermal process includes a rapid thermal process, and is conducted at a temperature of about 800 degree Celsius to about 1000 degree Celsius.

According to the preferred embodiment of the present invention, the selectivity ratio of the dielectric layer formed on the source/drain region to that on the selective-deposition dummy layer is greater than 1. The dielectric layer formed on the source/drain regions is thus thicker than the dielectric layer formed on the selective-deposition dummy layer. As a result, when the portion of the dielectric layer is removed to expose the selective-deposition dummy layer, a dielectric layer with a substantial thickness is still remained on the source/drain region. Being isolated by the dielectric layer, the metal layer is thus prevented to be in contact with the source/drain region. The metal silicide layer can be thereby formed by a self-aligned approach and is limited to the polysilicon gate. The present invention provides a method for forming a salicide layer on the polysilicon gate only. Photo lithography and etching of the salicide layer, which are conducted to selectively remove the salicide layer formed on the source/drain regions are thus eliminated.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A fabrication method for a salicide gate comprising the steps of:

forming a gate structure on a substrate, wherein the gate structure comprises a polysilicon gate and a selective-deposition dummy layer formed thereon and the selective-deposition dummy layer has a thickness;

forming a source/drain region on both sides of the gate structure in the substrate;

selectively forming a dielectric layer on the substrate, wherein a thickness of the dielectric layer on the source/drain region is greater than the thickness of the dielectric layer of the selective-deposition dummy layer;

removing a portion of the dielectric layer until the selective-deposition dummy layer is exposed;

removing the selective-deposition dummy layer to expose the polysilicon gate; and forming a salicide layer on the polysilicon gate to complete a formation of the salicide gate.

2. The method according to claim 1, wherein selectively forming a dielectric layer on the substrate includes a selective deposition process.

3. The method according to claim 2, wherein the dielectric layer is a silicon oxide layer, and the selective deposition process includes a chemical vapor deposition process using $O_3$/TEOS as a reactive gas source.

4. The method according to claim 3, wherein the selective-deposition dummy layer is a titanium nitride layer, and a ratio of the thickness of the silicon oxide layer formed on the source/drain region to the thickness of the silicon oxide layer formed on the selective-deposition dummy layer is controlled by adjusting the thickness of the selective-deposition dummy layer.

5. The method according to claim 3, wherein the selective-deposition dummy layer is a titanium nitride layer, and a ratio of the thickness of the silicon oxide layer formed on the source/drain region to the thickness of the silicon oxide layer formed on the selective-deposition dummy layer is controlled by adjusting the ratio of $O_3$ to TEOS in the chemical vapor deposition process.

6. The method according to claim 3, wherein the chemical vapor deposition includes atmospheric pressure chemical vapor deposition.

7. The method according to claim 3, wherein the chemical vapor deposition includes sub-atmospheric pressure chemical vapor deposition.

8. The method according to claim 1, wherein the dielectric layer includes silicon oxide.

9. The method according to claim 1, wherein the selective-deposition dummy layer includes titanium nitride.

10. The method according to claim 1, wherein forming the salicide layer on the polysilicon gate includes the steps of:
    forming a metal layer on the substrate;
    performing a first thermal process to induce a reaction between the metal layer and the polysilicon gate to form a salicide layer, wherein the thermal process is conducted at a temperature of about 400 degree Celsius to about 800 degree Celsius;
    removing an unreacted metal layer; and
    performing a second thermal process to lower a resistance of the salicide layer, wherein the second thermal process is conducted at a temperature of about 800 degree Celsius to about 1000 degree Celsius.

11. The method according to claim 10, wherein the metal layer includes titanium, cobalt, tungsten, nickel, palladium or platinum.

12. The method according to claim 10, wherein the first thermal process and the second thermal process include a rapid thermal process.

13. The method according to claim 1, wherein the thickness of the dielectric layer on the source/drain region is about 5 times the thickness of the dielectric layer on the selective-deposition dummy layer.

14. The method according to claim 1, wherein the thickness of the dielectric layer on the source/drain region is about 500 angstroms to about 1000 angstroms.

15. The method according to claim 1, wherein the thickness of the dielectric layer on the selective-deposition dummy layer is about 100 angstroms to about 200 angstroms.

16. A fabrication method for a salicide gate, wherein a substrate is provided, the method comprising the step of:
    forming a gate structure on the substrate, wherein the gate structure comprises a polysilicon gate and an selective-deposition dummy layer of a thickness formed on the polysilicon gate;
    forming a source/drain region on both sides of the gate structure in the substrate;
    forming a dielectric layer, wherein a thickness of the dielectric layer formed on the source/drain regions is greater than the thickness of the dielectric layer formed on the selective-deposition dummy layer;
    removing a portion of the dielectric layer until the selective-deposition dummy layer is exposed;
    removing the selective-deposition dummy layer to expose the polysilicon gate; and
    forming a salicide layer on the polysilicon gate to form a salicide gate.

17. The method according to claim 16, wherein the dielectric layer is a silicon oxide layer, and the dielectric layer is chemically vapor deposited using $O_3$/TEOS as a reactive gas source.

18. The method according to claim 17, wherein the selective-deposition dummy layer is a titanium nitride layer, and a ratio of the thickness of the silicon oxide layer formed on the source/drain region to the thickness of the silicon oxide layer formed on the selective-deposition dummy layer is controlled by adjusting the thickness of the selective-deposition dummy layer.

19. The method according to claim 17, wherein the selective-deposition dummy layer is a titanium nitride layer, and a ratio of the thickness of the silicon oxide layer formed on the source/drain region to the thickness of the silicon oxide layer formed on the selective-deposition dummy layer is controlled by adjusting the ratio of $O_3$ to TEOS in the chemical vapor deposition process.

20. The method according to claim 16, wherein the salicide layer includes titanium silicide, cobalt silicide, tungsten silicide, nickel silicide, palladium silicide or platinum silicide.

* * * * *